(12) United States Patent
Yu et al.

(10) Patent No.: US 8,174,832 B2
(45) Date of Patent: May 8, 2012

(54) STRUCTURE OF HEAT DISSIPATION SUBSTRATE FOR POWER LIGHT EMITTING DIODE (LED) AND A DEVICE USING SAME

(75) Inventors: Binhai Yu, Foshan (CN); Junzheng Li, Foshan (CN); Xunli Xia, Foshan (CN)

(73) Assignee: Foshan Nationstar Optoelectronics Co., Ltd., Foshan, Guangdong (CN)

( * ) Notice: Subject to any disclaimer, the term of this patent is extended or adjusted under 35 U.S.C. 154(b) by 147 days.

(21) Appl. No.: 12/527,295

(22) PCT Filed: Oct. 15, 2008

(86) PCT No.: PCT/CN2008/001740
§ 371 (c)(1),
(2), (4) Date: Aug. 14, 2009

(87) PCT Pub. No.: WO2009/052702
PCT Pub. Date: Apr. 30, 2009

(65) Prior Publication Data
US 2010/0110692 A1    May 6, 2010

(30) Foreign Application Priority Data

Oct. 15, 2007 (CN) .......................... 2007 1 0030850

(51) Int. Cl.
*H05K 7/20* (2006.01)
*F21V 29/00* (2006.01)

(52) U.S. Cl. ........ 361/709; 361/710; 361/697; 257/706; 257/707; 257/722; 362/294

(58) Field of Classification Search .................. 361/710, 361/709, 697; 257/706, 707, 722; 362/294; 165/185
See application file for complete search history.

(56) References Cited

U.S. PATENT DOCUMENTS

| | | | | |
|---|---|---|---|---|
| 4,729,076 A | * | 3/1988 | Masami et al. | ............... 362/235 |
| 4,772,999 A | * | 9/1988 | Fiorina et al. | ................. 363/141 |
| 4,959,761 A | * | 9/1990 | Critelli et al. | ................. 362/646 |
| 5,782,555 A | * | 7/1998 | Hochstein | ..................... 362/373 |

(Continued)

FOREIGN PATENT DOCUMENTS

CN       2574224 Y       9/2003
(Continued)

OTHER PUBLICATIONS

Form PCT/ISA/210 of PCT/CN2008/001740 dated Jan. 15, 2009.
(Continued)

*Primary Examiner* — Anatoly Vortman
(74) *Attorney, Agent, or Firm* — Buchanan Ingersoll & Rooney PC

(57) ABSTRACT

A structure of a heat dissipation substrate of power LEDs and a device made by using the same overcomes drawbacks such as complex structure of power LEDs, strict manufacturing process, low production efficiency, high production cost, and unreliable product quality. The structure of the heat dissipation substrate includes a one-piece circuit board having a counterbore and metal lines thereon, wherein the counterbore is formed by a through hole and a blind hole communicating with each other. The through hole is smaller than the blind hole, and both of them share the same direction of axis. The heat sink has a one-piece terraced structure formed by a upper terrace and a lower terrace; the heat sink matches the counterbore to form a firm fit.

22 Claims, 5 Drawing Sheets

U.S. PATENT DOCUMENTS

| | | | |
|---|---|---|---|
| 5,785,418 A * | 7/1998 | Hochstein | 362/373 |
| 5,857,767 A * | 1/1999 | Hochstein | 362/294 |
| 5,998,925 A * | 12/1999 | Shimizu et al. | 313/503 |
| 6,069,440 A * | 5/2000 | Shimizu et al. | 313/486 |
| 6,472,823 B2 * | 10/2002 | Yen | 315/112 |
| 6,517,218 B2 * | 2/2003 | Hochstein | 362/294 |
| 6,531,328 B1 * | 3/2003 | Chen | 438/26 |
| 6,568,833 B2 * | 5/2003 | Worgan et al. | 362/247 |
| 6,670,751 B2 * | 12/2003 | Song et al. | 313/512 |
| 6,799,864 B2 * | 10/2004 | Bohler et al. | 362/236 |
| 6,799,870 B2 * | 10/2004 | Lin | 362/294 |
| 6,999,318 B2 * | 2/2006 | Newby | 361/719 |
| 7,096,678 B2 * | 8/2006 | Petroski | 62/3.2 |
| 7,119,422 B2 * | 10/2006 | Chin | 257/666 |
| 7,157,745 B2 * | 1/2007 | Blonder et al. | 257/98 |
| 7,176,502 B2 * | 2/2007 | Mazzochette et al. | 257/99 |
| 7,196,459 B2 * | 3/2007 | Morris | 313/46 |
| 7,355,856 B2 * | 4/2008 | Petroski | 361/710 |
| 7,374,316 B2 * | 5/2008 | Kuo et al. | 362/373 |
| 7,420,811 B2 * | 9/2008 | Chan | 361/709 |
| 7,524,741 B2 * | 4/2009 | Ushida et al. | 438/503 |
| 7,549,773 B2 * | 6/2009 | Lim | 362/294 |
| 7,554,129 B2 * | 6/2009 | Roth et al. | 257/100 |
| 7,633,093 B2 * | 12/2009 | Blonder et al. | 257/81 |
| 7,676,915 B2 * | 3/2010 | Ter-Hovhannissian | 29/840 |
| 7,728,341 B2 * | 6/2010 | Mazzochette et al. | 257/98 |
| 2002/0175621 A1 | 11/2002 | Song et al. | |

FOREIGN PATENT DOCUMENTS

| | | |
|---|---|---|
| CN | 1466230 A | 1/2004 |
| CN | 1684278 A | 10/2005 |
| CN | 1977399 A | 6/2007 |
| CN | 101140972 A | 3/2008 |
| CN | 201129674 Y | 10/2008 |
| WO | WO 2006/104325 A1 | 10/2006 |

OTHER PUBLICATIONS

Non-formal comments by Applicant in response to the Written Opinion of PCT/CN2008/001740 dated Mar. 18, 2009.

* cited by examiner

US 8,174,832 B2

STRUCTURE OF HEAT DISSIPATION SUBSTRATE FOR POWER LIGHT EMITTING DIODE (LED) AND A DEVICE USING SAME

FIELD

The disclosure relates to a structure of heat dissipation substrate of a power Light Emitting Diode (hereinafter LED) and a device including a heat dissipation substrate, especially to a heat dissipation substrate with a structure having a counterbore and a heat sink and a device using the heat dissipation substrate.

BACKGROUND INFORMATION

A LED, is a common component adopted in daily appliances due to advantages such as small size, long service life, low driving voltage, low power consumption, quick response, and good shock resistance etc. A working LED light source will generate heat, a value of which is in proportion to its power value. Earlier LED devices had power limited to milliwatts due to manufacturing technology. In recent years, new technologies were developed to enhance the power of LED devices and thus products using more power, for example, more than 100 milliwatts, were developed and are referred to as a power LED. As power LEDs have been applied in the field of illumination, high power LEDs using power of over 1 W have been developed and gradually applied in various areas of illumination. The power LED will generate heat when working. After the LED light source has been working for a long time, its accumulated heat will result in a short lifetime and unstable product performance. In order to resolve the problem of heat dissipation of a LED chip when working, prior art power LEDs adopted complex encapsulation structures.

Common supporting substrates used in prior art high power LEDs can be divided into framework, ceramics substrate, etc. FIG. 1 shows an encapsulation structure of a framework type power LED, which includes a heat dissipation plate 102 in addition to an ordinary Plastic Leaded Chip Carrier (hereinafter referred to as a PLCC). The framework structure is characterized in that a white or black colloid 104 is plastic-sealed over a metal frame 103 to form a cavity, an electrode lead 103 and a heat dissipation plate 102 are fixed, a chip 105 and a heat sink 106 are mounted within a reflective cup of the heat dissipation plate 102, and an optical lens 108 is mounted on top of the framework.

FIG. 2 shows an encapsulation structure of a ceramics substrate type power LED. The power LED is mainly characterized in that a chip 201 is mounted on a ceramic substrate 202 with a circuit printed thereon, with the ceramic substrate 202 and its circuit together forming a structure of heat dissipation and an electric connection of LED. On the top of the ceramic substrate 202 is mounted a metal reflective cavity 203, which supports a lens 204 and forms an optical structure. The ceramic substrate has a complex manufacturing process, low production efficiency, high cost, and limited capability of heat dissipation, and thus limited room for power enhancement of LED devices based on the ceramic substrate.

As production scale of the power LEDs has been expanded and an application field of power LEDs extended, the weaknesses of the product structure mentioned above, such as complex processing, low production efficiency etc., have become critical.

In order to cut down manufacturing cost, there has been developed a support (i.e., substrate) of power LED by means of assembling a heat sink in a circuit plate. However, this kind of substrate has disadvantages such as complex structure, strict requirement of manufacture process, less reliability and bad heat dissipation, leading to relatively high manufacturing costs, less reliability and short lifetime of the power LEDs product.

For example, a PCT patent application WO2006104325 discloses assembling a heat sink, in which, as shown in FIG. 3, multiple layers of circuit plates (301, 302, 303, 304, 4 layers in total) with through holes are stacked together to form a cavity for assembling a heat sink 305. However, these layers of circuit plates need to be stacked, assembled and welded, and there is a strict requirement for position in the manufacturing process. Also, when welding of the stacked circuit plates, defects such as inveracious soldering and an unflat joint may occur, leading to high manufacturing cost, high processing difficulty and low production efficiency.

To overcome the problem of heat dissipation for a LED device, there is a solution of opening a hole in the heat dissipation plate and embedding a heat sink in the hole. For example, a Chinese patent CN1977399A discloses a solution, in which a LED substrate is obtained by means of assembling a heat sink 404 with a circuit board 403, as shown in FIG. 4, a through hole structure 401 of the circuit board 403 is combined with the heat sink 404, and the circuit board 403 or the heat sink 404 has a conical surface 402. This solution is not suitable for high power LED devices because of a lower heat dissipation capacity of the heat sink. During manufacture, the binding between the heat sink and the through hole is weak so that the heat sink can easily break off and is difficult to locate. This results in low reliability and bad heat dissipation. In addition, the machining process of a conical surface on the circuit board has bad consistency and thus product quality is hard to guarantee.

Furthermore, there is a problem of low production efficiency and high cost for mass production of LED products due to the complex structures of heat dissipation substrate of the power LED. Therefore, there is a need to develop a new product, which has high production efficiency, simple structure and low production cost, so as to meet demand of the booming market.

SUMMARY

An objective of the disclosure is to overcome the drawbacks of prior art, i.e., complex structure, strict process requirement, low feasibility and bad heat dissipation of heat dissipation substrate in power LEDs, and low manufacturing efficiency, bad product consistency and reliability, and high product cost of the power LED devices.

Another objective of the disclosure is to provide a heat dissipation substrate with a heat sink assembled in a circuit board, and a power LED device including the heat dissipation substrate. The heat dissipation substrate has a simple structure, is easy to manufacture, lowers process requirements and can effectively solve heat dissipation problems of the power LED devices, especially that of high power LED devices. The device manufactured by the heat dissipation substrate has good consistency, high reliability and good heat dissipation. The device still has high production efficiency, simple structure, low product cost, and can boost the power of power LEDs. It can ensure that the power LED product according to the disclosure will satisfy the booming market.

To achieve the above objectives, a structure of heat dissipation substrate used for manufacturing a power LED is provided. The structure of heat dissipation substrate comprises: a circuit board, said circuit board being of an one-piece structure and with a counterbore and metal lines arranged thereon, wherein the counterbore is structured as a through hole and a blind hole communicating with each other, the through hole is smaller than the blind hole, and the axis direction of both the through hole and the blind hole are the same; The heat sink has an one-piece terraced structure formed by an upper terrace and a lower terrace, wherein the diameter of the upper terrace is close to the aperture of the through hole and the diameter of the lower terrace is close to the aperture of the blind hole, the height of the lower terrace of the heat sink is greater than or equal to the depth of the blind hole, the upper terrace and the lower terrace share the same direction of axis; the heat sink matches in structure with the counterbore, and the heat sink can be embedded firmly in the counterbore. Due to its one-piece structure, the structure of heat dissipation substrate simplifies complex multilayer structure existing in prior art circuit board and effectively ensures process quality of the heat dissipation substrate. The heat sink and the circuit board are structured to enable a remarkably simple process for assembling the heat sink in the counterbore of the heat dissipation substrate, by which the heat sink can be firmly fit, reliably positioned and uneasy to slip, thus the assembly quality is highly guaranteed. Furthermore, the lower terrace in the one-piece structure of the head sink has a volume bigger than that of the upper terrace, providing a heat sink with bigger thermal capacity and larger heat dissipation area; when assembled in the counterbore, the bottom of the heat sink is flush with or it extrudes from the printed circuit board so that the heat sink may be enabled to contact with other heat-transfer medium to dissipate the heat, thus achieving a very good heat dissipation and greatly boosting the development of power LED. The power LED is designed to deliver high power. The heat dissipation substrate has a simple structure, is easy to manufacture and greatly reduces product cost of the heat dissipation substrate of the power LED.

To achieve the above objectives, the device also provides a second heat dissipation substrate having a plurality of counterbores and heat sinks, with the heat dissipation substrate mentioned above acting as a basic element thereof. The second heat dissipation substrate has a one-piece circuit board, at terminating ends of which position lines for cutting are placed and within which slots and/or holes are placed. In the circuit board, an array, M column×N rows, of counterbores is placed, wherein M and N are respectively integers more than or equal to 1, and M and N cannot be equal to 1 simultaneously. Each of the heat sinks is in an interference fit with the corresponding counterbore of the array of counterbores. This second structure of heat dissipation substrate overcomes drawbacks existing in manufacturing process of power LEDs, such as, complex processes, power LEDs being manufactured piece by piece and bad consistency of product. By simple design of the heat dissipation substrate, a plurality of power LEDs can be manufactured on the same heat dissipation substrate. When manufacturing LED devices from the heat dissipation substrate, the substrate is first encapsulated with colloid and then cut along the position lines for cutting so that the encapsulated LED products can be divided into independent LED devices. The device simplifies manufacturing process of power LED devices, with production efficiency enhanced, production cost reduced, and good consistency of product quality achieved.

In order to meet the above objectives, the device provides a power LED device manufactured by using the above heat dissipation substrate of power LED. The power LED device comprises a heat sink, the circuit board with a counterbore, a LED chip, bonding wires, and an encapsulation colloid, wherein the heat sink is in an interference fit with the counterbore of the circuit board, the LED chip is mounted on the heat sink, the lines of the circuit board, having internal wire connection parts and external electrodes, act as device electrodes, with the bonding wires connecting LED chip electrodes to the internal wire connection parts on the circuit board. Then, the encapsulation colloid is used to cover the side of the circuit board carrying the chip, keeping the external electrodes outside. The encapsulation colloid functions not only as a sealing layer for sealing the chip and the bonding wires from outside moisture and air, but also as an optical lens integrated with the device. The above power LED device manufactured by using the heat dissipation substrate has desirable heat dissipation, enabling a great power boost of the power LED device. It can be manufactured in batches due to the heat dissipation substrate structure and simple encapsulation, providing good consistence for the power LED devices and achieving high production efficiency. More importantly, due to the fact that the encapsulation colloid functions as an one-shot forming optical lens, the light extracting characteristic of the power LED device has been improved when compared to a prior art device with lens assembled on encapsulation colloid. The power LED device has a simple and compact structure, high product reliability, and low production cost. Because the heat dissipation substrate has a good characteristic of heat dissipation, the power LED device manufactured by using the heat dissipation substrate of the invention can use more power. Thus the device can yield a LED device using high power. Using the simple and practical design of the heat dissipation substrate adopting the counterbore and heat sink, complex manufacturing technology of LED can be simplified, production efficiency of a power LED device can be greatly improved and the lifetime of a power LED device can be extended.

Figure 1:
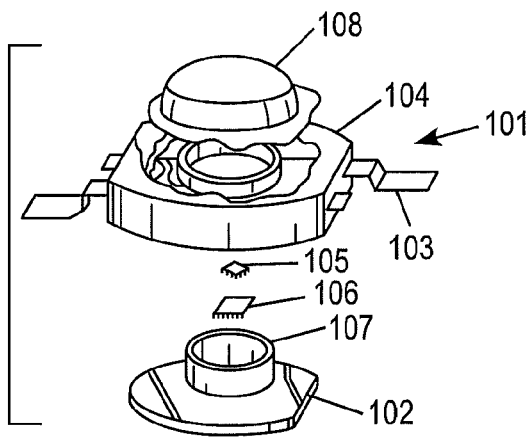
FIG. 1 shows a prior art encapsulation structure of lead framework type for power LED.
Figure 2:
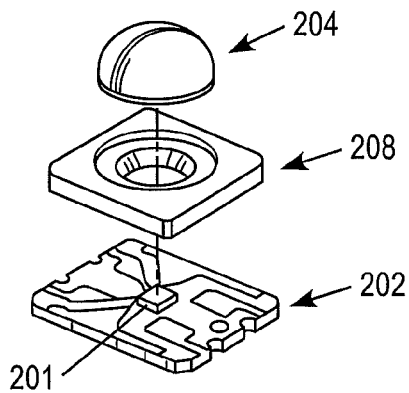
FIG. 2 shows a prior art encapsulation structure of ceramics substrate type for power LED.
Figure 3:
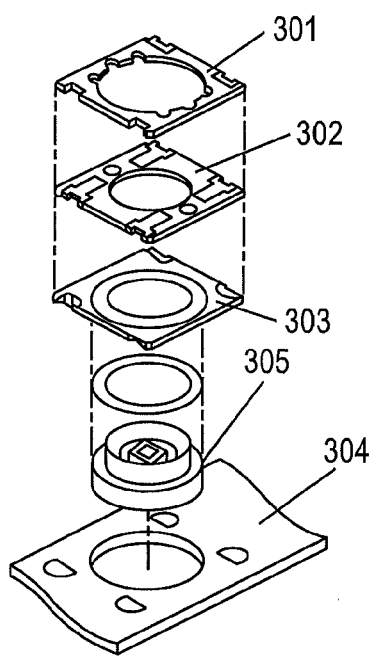
FIG. 3 shows a prior art structure of supporting substrate of power LED manufactured by assembling a heat sink with a circuit plate.
Figure 4:
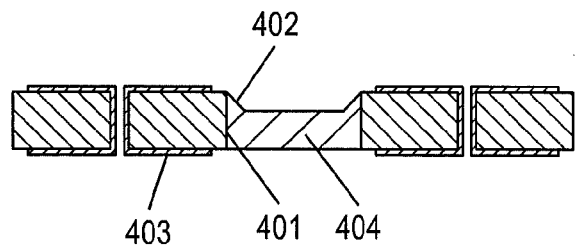
FIG. 4 shows a prior art structure of heat dissipation substrate manufactured by assembling a heat sink with a circuit board.

REFERENCE NUMBER 1 circuit board; 2 counterbore: through hole 2a, blind hole 2b; 3 metal line, device electrode: internal wire connection part 3a, external electrode 3b; 4 heat sink: upper terrace 4a, lower terrace 4b; 5 position line for cutting; 6 slot; 7 hole; 8 LED chip; 9 bonding wire; 10: encapsulation colloid.

DETAILED DESCRIPTION

Embodiment 1

Figure 5:
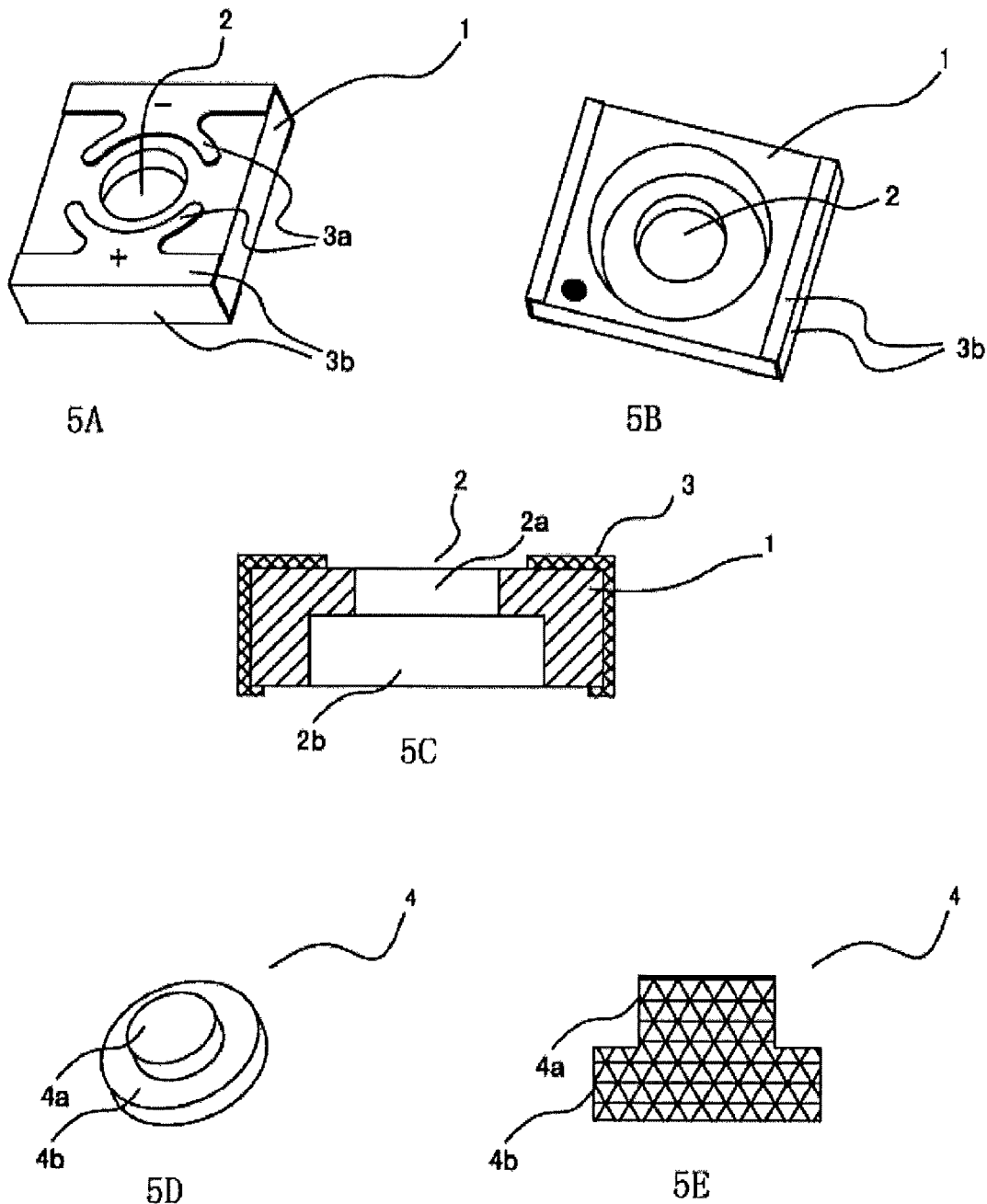
FIG. 5 shows a schematic diagram of heat dissipation substrate according to a first embodiment of the invention.
Figure 6:
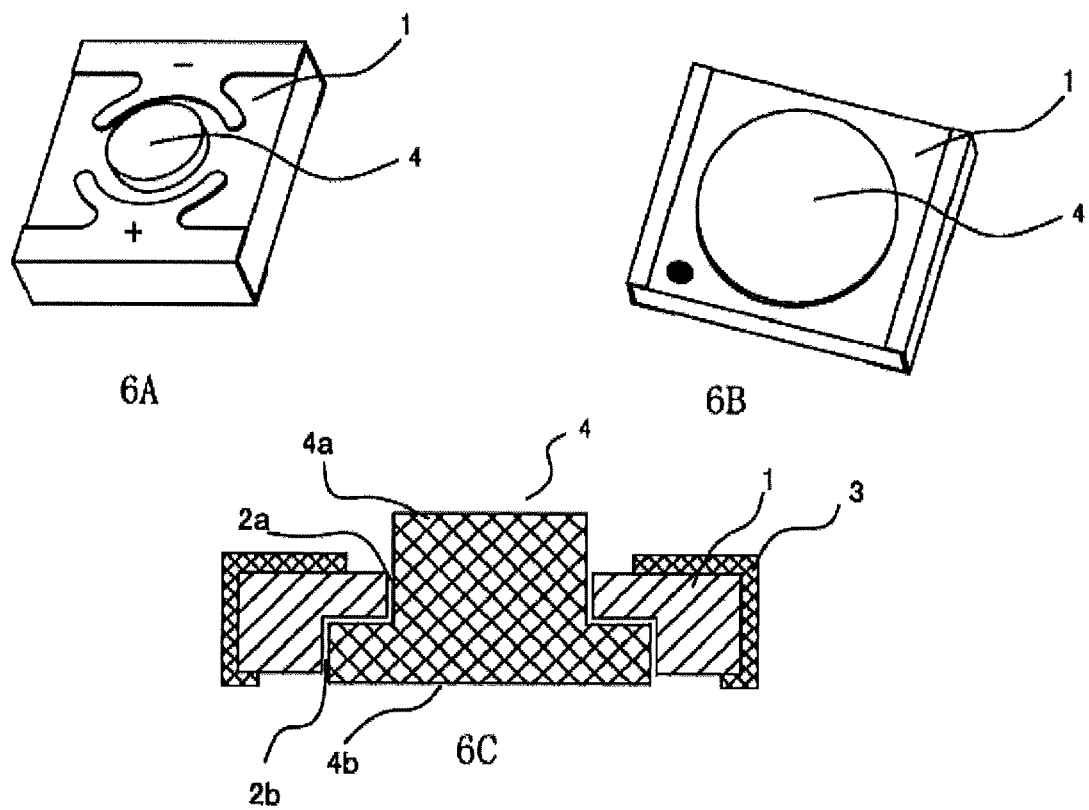
FIG. 6 shows schematic diagrams and sectional views of the assembly of a counterbore with a heat sink according to the first embodiment of the invention.

Referring to FIG. 5 and FIG. 6, a preferred embodiment 1 of the heat dissipation substrate used for manufacturing power LED will be described. In this embodiment, FIG. 5 and FIG. 6 show a basic schematic diagram of a circuit board 1 and a heat sink 4 forming a heat dissipation substrate. FIG. 5A illustrates the upper surface of the heat dissipation substrate, FIG. 5B illustrates the lower surface of the heat dissipation substrate, FIG. 5C shows a sectional view of the heat dissipation substrate with the heat sink 4 embedded in the counterbore 2, and FIGS. 5D and 5E respectively show a cubic chart and a sectional view of the heat sink. In the embodiment, the circuit board 1 has a one-piece structure, on which a counterbore 2 and metal lines 3 are placed, wherein the metal lines 3 act as electrodes of the device, and include internal wire connection parts 3a and external electrodes 3b. The counterbore includes two holes, through hole 2a and blind hole 2b, communicating with each other. The through hole 2a is smaller than the blind hole 2b, and both of the through hole 2a and the blind hole 2b share the same direction of axis and are perpendicular to the upper and lower surfaces of the circuit board 1. The heat sink 4 has a one-piece terraced structure formed by an upper terrace 4a and a lower terrace 4b, wherein the diameter of the upper terrace 4a is close to the aperture of the through hole 2a, and that of the lower terrace 4b is close to the aperture of the blind hole 2b, and the upper terrace 4a shares the same direction of axis as the lower terrace 4b. Because the heat sink is in match with the counterbore 2, the heat sink 4 can be embedded in the counterbore 2 to fit firmly with each other; preferably, the heat sink 4 may be embedded in the counterbore 2 by means of an interference fit or by bonding with adhesive.

FIG. 6 shows a schematic diagram of the circuit board 1 according to a preferred scheme of the invention, with the counterbore 2 and the heat sink 4 being assembled. As regard to the height of the heat sink 4, the height of the lower terrace 4b of the heat sink is preferably equal to or greater than the depth of the blind hole 2b, so that the bottom of the heat sink 4 after assembly is flush with or extrudes from the circuit board 1, in this way the heat sink 4 is easier to contact the heat-transfer medium to dissipate the heat. In another preferred embodiment, the height of the upper terrace 4a of the heat sink is equal to or greater than the depth of the through hole 2a so that the top of the heat sink 4 after assembly is flush with or extrudes from the circuit board 1. In this way the LED chip achieves a good light extracting effect when being assembled on the top of the heat sink.

Figure 7:
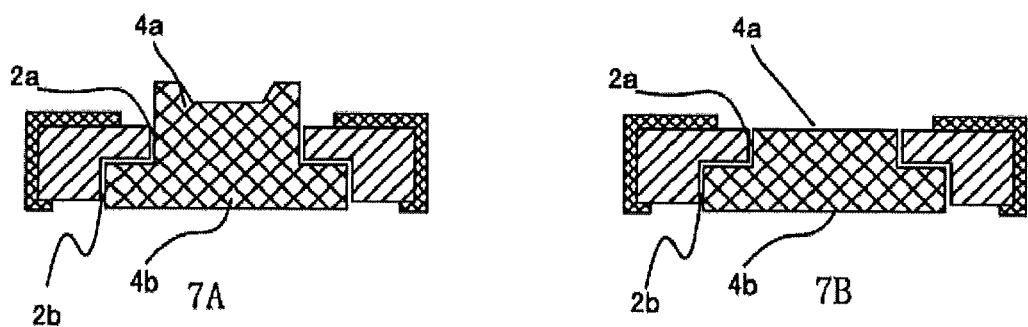
FIG. 7 shows a schematic diagram of a preferred scheme of the first embodiment of the invention.
Figure 8:
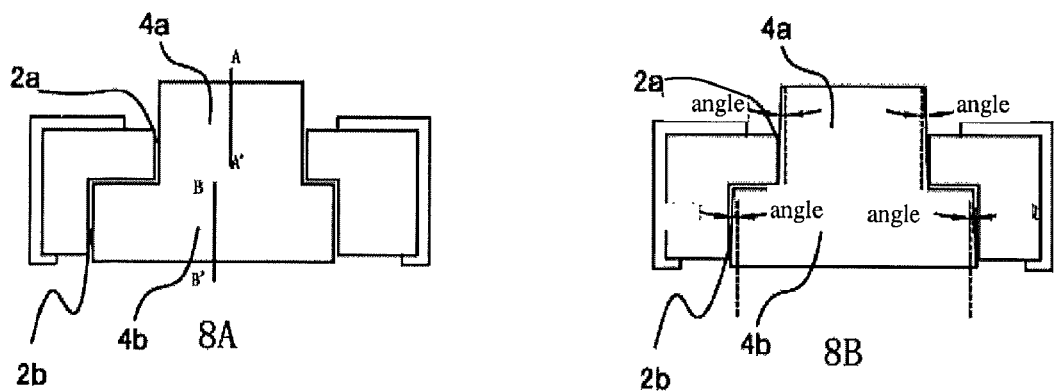
FIG. 8 shows a schematic diagram of a preferred scheme of the first embodiment of the invention.

According to FIG. 7 and FIG. 8, preferred embodiments for manufacturing power LED of the invention will be described as below. As shown in FIG. 7 and FIG. 8, in the embodiment, the cross section of the blind hole 2b and the through hole 2a may be arbitrary rotundity or polygon, respectively. In the invention, the arbitrary rotundity means round, oval or irregular rotundity, and the arbitrary polygon means a polygon formed by arcs, straight lines, or a combination of arcs and straight lines. Preferably, the cross section of the blind hole 2b may be round and that of the through hole 2a may be round or square. The cross section of the lower terrace 4b of the heat sink 4 may be an arbitrary rotundity or an arbitrary polygon corresponding to that of the blind hole 2b, and the cross section of the upper terrace 4a may be an arbitrary rotundity or an arbitrary polygon corresponding to that of the through hole 2a. The diameter of the upper terrace 4a is close to the aperture of the through hole 2a and the diameter of the lower terrace 4b is close to the aperture of the blind hole 2b, so that the heat sink 4 can be embedded in the counterbore 2 to make a firm fit therewith. FIG. 7A shows a preferred scheme, in which the top of upper terrace 4a of the heat sink is a planar surface or a concave reflective cup. FIG. 8A shows that the through hole 2a and the blind hole 2b share the same direction of axis and they may or may not be coaxial. Preferably, the through hole 2a and the blind hole 2b are not coaxial. Correspondingly, the upper terrace 4a and the lower terrace 4b share the same direction of axis and may or may not be coaxial. Preferably the upper terrace 4a and the lower terrace 4b are not coaxial so that the heat sink 4 is easier to be mounted and fit in the counterbore 2. FIG. 8B further shows a preferred scheme in which the top of the upper terrace 4a of the heat sink has a cross section slightly smaller than that of the bottom of the upper terrace 4a so that the upper terrace 4a presents a conical shape, and the top of the lower terrace 4b has a cross section slightly smaller than that of the bottom of the lower terrace 4b so that the lower terrace 4b presents a conical shape. Preferably the height of the lower terrace 4b of the heat sink is equal to or greater than the depth of the blind hole 2b so that it is easy to assemble the heat sink by interference fit or bonding with adhesive.

Embodiment 2

According to FIG. 9, FIG. 10 and FIG. 11, a heat dissipation substrate of a preferred embodiment 2 of the invention used for manufacturing a power LED is shown and will be described as blow.

Figure 9:
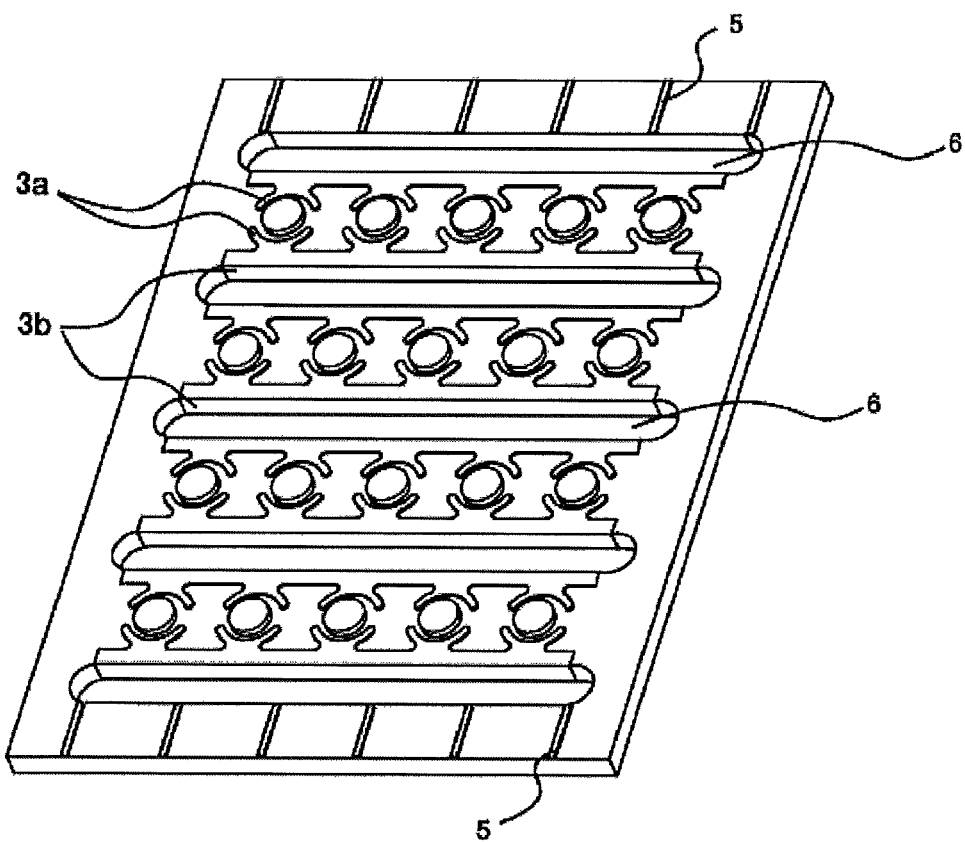
FIG. 9 shows a schematic diagram of a preferred scheme of a second embodiment of the heat dissipation substrate of the invention.

FIG. 9 shows a heat dissipation substrate having a plurality of counterbores, with the heat dissipation substrate of the previous embodiment acting as its basic element. The heat dissipation substrate has a one-piece circuitboard, on or in which position lines for cutting 5, slots 6 and/or holes 7 (not shown) are placed; an array, M column×N row, of counterbores is placed in the circuit board, wherein M and N are integers greater than or equal to 1, and M and N can not be equal to 1 simultaneously. There are a plurality of position lines for cutting 5, each corresponding to either end of each counterbore column and/or row; there are a plurality of slots 6 and/or holes 7, which are placed at the side of each counterbore column and/or row (as shown in FIG. 10, there is of a hole 7 set at the side of each counterbore). The heat sinks are embedded in the corresponding counterbores and fit firmly with them by an interference fit or by adhesive. The interference fit is preferred.

There is a preferred scheme: as shown in FIG. 9, M+1 position lines for cutting 5 are placed at either end of each counterbore column on the circuit board, each corresponding to the middle between two adjacent counterbore columns; each of N+1 slots 6 is located in the middle between two adjacent counterbore rows, extending along the counterbore rows. In FIG. 9, with respect to an array of counterbores with 5 columns and 4 rows, there are six position lines for cutting 5 and five slots 6. In this preferred scheme, the device electrodes 3 are placed on the upper, lower and inner surfaces at both sides of the slots on the circuit board.

Figures 10, 11:
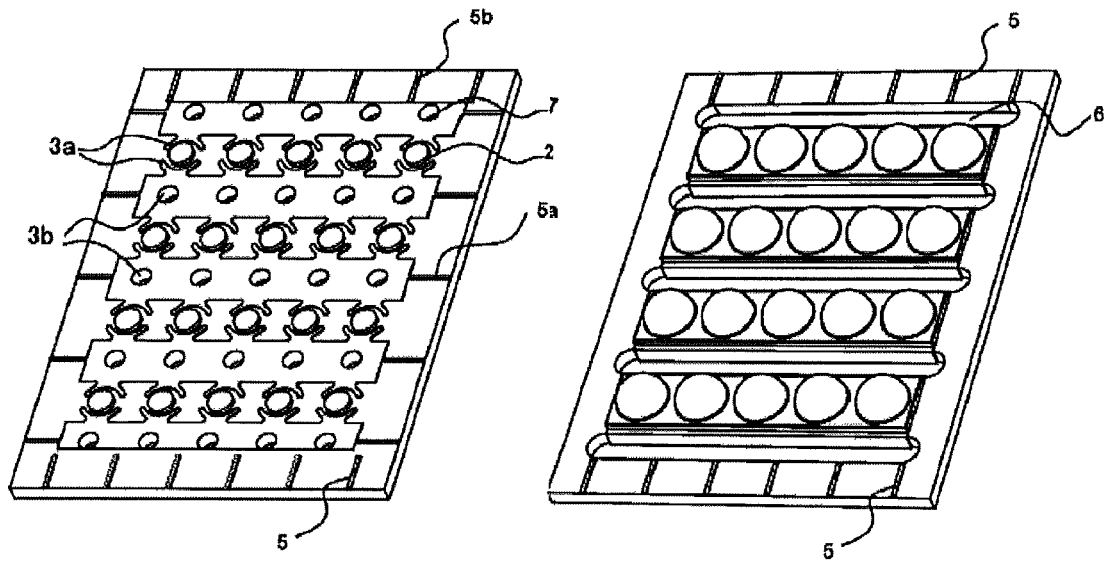
FIG. 10 shows a schematic diagram of a preferred scheme of the second embodiment of the heat dissipation substrate of the invention.
FIG. 11 shows a schematic diagram of the heat dissipation substrate after chip encapsulation according to the second embodiment of the invention.

FIG. 10 shows another preferred scheme according to the embodiment 2 of the invention. N+1 position lines for cutting 5a are placed at ends of counterbore rows on the circuit board, each corresponding to the middle between two adjacent counterbore rows (for example, in FIG. 10, with respect to an array of counterbores with 5 columns×4 rows, there are 5 position lines for cutting 5a); M+1 position lines for cutting 5b are placed at ends of counterbore columns on the circuit board, each corresponding to the middle between two adjacent counterbore columns (for example, in FIG. 10, six position lines for cutting 5b are shown); the plurality of slots 6 (not shown) and/or hole 7 are collinear with the position lines for cutting placed at both ends of counterbore columns or rows. Preferably, a slot 6 or a hole 7 is arranged at either side of each counterbore 2 of every counterbore row or column on the circuit board 1. On the circuit board 1, device electrodes 3 are arranged along both sides of the plurality of slots and/or holes at places that correspond to the counterbores, and internal wire connection parts 3a, each corresponding to a counterbore, are arranged. The device electrodes 3 are arranged on the upper, lower and inner surfaces at both sides of the said slot 6 or hole 7 on the circuit board. As shown in FIG. 10, a plurality of holes 7 are lined up along and at sides of respective counterbore rows, each hole 7 corresponding to each counterbore. Of course, the hole 7 may be replaced by slot 6 according to the above scheme.

FIG. 11 shows a cubic chart of a power LED device manufactured by encapsulating the heat dissipation substrate of preferred schemes in the previous embodiment of the invention. If it is cut along the position lines for cutting, independent power LED devices as shown in FIG. 13 can be easily obtained.

Figures 12, 13:
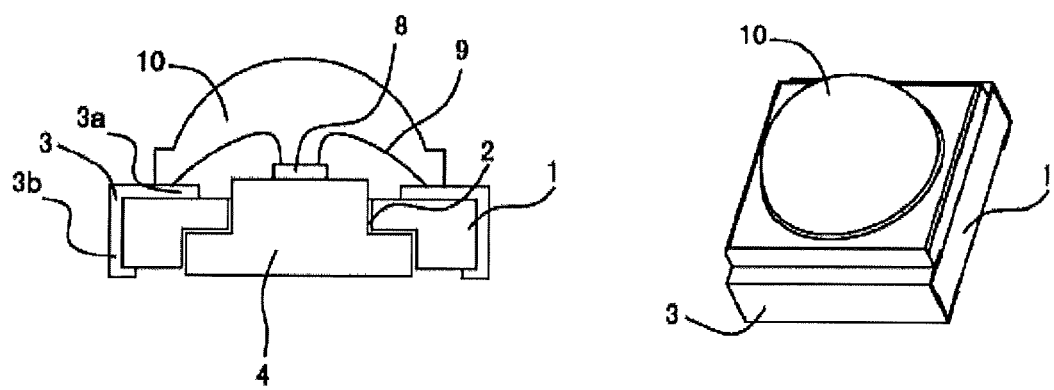
FIG. 12 shows a sectional view of power LED device according to an embodiment of the invention.
FIG. 13 shows a cubic chart of power LED device according to an embodiment of the invention.

FIG. 12 shows a schematic diagram of power LED device manufactured with the heat dissipation substrate of the invention. The device comprises: a heat sink 4, a circuit board 1 with a counterbore structure, a LED chip 8, bonding wires 9, encapsulation colloid 10, and device electrodes 3. Wherein, the heat sink 4 fits firmly with the counterbore 2 of the circuit board 1; the LED chip 8 is mounted on the heat sink 4; the metal lines 3, including internal wire connection parts 3a and external electrodes 3b of circuit board 1, form electrodes 3; and, the bonding wires 9 connect the electrodes of the LED chip to the internal wire connection parts on the circuit board 1; the encapsulation colloid 10 covers the side of the circuit board 1 carrying the chip and keeps the external electrodes 3b outside; the encapsulation colloid 10 functions not only as a sealing layer for sealing the chip and the bonding wire, but also as an optical lens integrated with the device. Preferably, the optical lens integrated with the device may be a convex lens, a concave lens or a combined toroidal lens. Furthermore, the number of chips arranged on the heat sink may be 1 or more than 1.

In comparison with the prior art power LEDs, the power LED device of the invention is simple and compact. The power LED device manufactured with the heat dissipation substrate offers room for power enhancement, and is especially suitable to achieve a LED device with high power, so as to achieve the aim of manufacturing a power LED device with high performance, high quality at low cost and high efficiency.

The invention claimed is:

1. A structure of a heat dissipation substrate for manufacturing a power LED, wherein the structure of the heat dissipation substrate comprises:

a one-piece printed circuit board, on which a counterbore and metal lines are arranged; wherein, the counterbore is perpendicular to a surface of the printed circuit board and structured as a through hole and a blind hole communicating with each other, the through hole is smaller than the blind hole and both the through hole and the blind hole share a same direction of axis;

a heat sink, having one-piece terraced structure formed by an upper terrace and a lower terrace, wherein a diameter of the upper terrace is close to an aperture of the through hole and a diameter of the lower terrace is close to an aperture of the blind hole; the upper terrace and the lower terrace share the same direction of axis and they are perpendicular to upper and lower surfaces of the printed circuit board; a height of the lower terrace is greater than or equal to a depth of the blind hole;

wherein, the heat sink is in match with the counterbore and the heat sink is embedded in the counterbore to form a firm fit.

2. The structure of heat dissipation substrate according to claim 1, wherein:

the cross section of the blind hole is circular or polygon, and that of the through hole is circular or polygon; the cross section of the lower terrace of the heat sink is circular or polygon, corresponding to that of the blind hole, and the cross section of the upper terrace of the heat sink is circular or polygon, corresponding to that of the through hole.

3. The structure of heat dissipation substrate according to claim 1, wherein the height of the upper terrace of the heat sink is equal to or greater than the depth of the through hole.

4. The structure of heat dissipation substrate according to claim 1, wherein there is a planar or concave reflective cup on the top of the upper terrace of the heat sink.

5. The structure of heat dissipation substrate according to claim 1 wherein the through hole and the blind hole are not coaxial, and correspondingly the upper terrace and the lower terrace are not coaxial.

6. The structure of heat dissipation substrate according to claim 1 wherein the through hole and the blind hole are coaxial, and the upper terrace and the lower terrace are coaxial.

7. The structure of heat dissipation substrate according to claim 2, wherein the cross sections of the blind hole and the lower terrace are circular, and that the cross sections of the through hole and the upper terrace are circular or square.

8. The structure of heat dissipation substrate according to claim 1, wherein the upper terrace of the heat sink presents a shape of a cone, with its top smaller in cross section than its bottom; and, the lower terrace of the heat sink presents a shape of a cone, with its top smaller in cross section than its bottom.

9. The structure of heat dissipation substrate according to claim 1, wherein the heat sink and the counterbore are fit firmly with each other by an interference fit or bonded by adhesive.

10. The structure of heat dissipation substrate according to claim 1, wherein at an end of the one-piece printed circuit board, position lines for cutting are arranged, and in the one-piece printed circuit board at least one of slots and holes are arranged.

11. A power LED device manufactured by using the structure of heat dissipation substrate according to claim 1, wherein the device comprises:

a heat sink, a printed circuit board with a counterbore, a LED chip, bonding wires, an encapsulation colloid, wherein, the heat sink fits firmly with the counterbore of the printed circuit board; the LED chip is mounted on the heat sink; the metal lines of the printed circuit board, having internal wire connection parts and external electrodes, form device electrodes, and bonding wires connect electrodes of the LED chip to the internal wire connection parts on the printed circuit board; the encapsulation colloid covers the side of the printed circuit board carrying the chip and keeps the external electrodes outside, and the encapsulation colloid functions as a sealing layer for sealing the chip and the bonding and as an optical lens integrated with the device.

12. The power LED device according to claim 11, wherein an optical lens integrated with the device is a convex lens, concave lens or combined toroidal lens; the external electrodes function as positive and negative electrodes of the device, the number of the chip arranged on the heat sink may be at least 1.

13. A structure of a heat dissipation substrate for manufacturing a power LED, wherein the structure of the heat dissipation substrate comprises:
a one-piece printed circuit board, on which a counterbore and metal lines are arranged; wherein, the counterbore is perpendicular to a surface of the printed circuit board and structured as a through hole and a blind hole communicating with each other, the through hole is smaller than the blind hole and both the through hole and the blind hole share a same direction of axis;
a heat sink, having one-piece terraced structure formed by an upper terrace and a lower terrace, wherein a diameter of the upper terrace is close to an aperture of the through hole and a diameter of the lower terrace is close to an aperture of the blind hole; the upper terrace and the lower terrace share the same direction of axis and they are perpendicular to upper and lower surfaces of the printed circuit board, a height of the lower terrace is greater than or equal to a depth of the blind hole;
wherein the heat sink is in match with the counterbore and the heat sink is embedded in the counterbore to form a firm fit;
wherein at an end of the one-piece printed circuit board, position lines for cutting are arranged, and in the one-piece printed circuit board at least one of slots and holes are arranged;
wherein a counterbore array, having M counterbore columns and N counterbore rows, is arranged on the circuit board, wherein M and N are respectively integers equal to or greater than 1, and they could not be equal to 1 simultaneously;
the number of the position lines for cutting is more than 1, and each position line for cutting corresponds to a side of each counterbore column or each counterbore row;
the number of the slots and/or the holes is more than 1, and each slot and/or hole is arranged by the side of each counterbore column or each counterbore row;
the heat sink is embedded in each counterbore, and each pair of heat sinks and counterbores are fit firmly together by an interference fit or bonded firmly by adhesive.

14. The structure of heat dissipation substrate according to claim 13, wherein each of M+1 position lines for cutting is arranged at either end of counterbore columns on the circuit board, corresponding to the middle between two adjacent counterbore columns; the number of slots is N+1, and each slot is a through slot, extending along the side of each counterbore row and being located in the middle between two adjacent counterbore rows.

15. The structure of heat dissipation substrate according to claim 14, wherein device electrodes are arranged along both sides of the slots on the printed circuit board.

16. The structure of heat dissipation substrate according to claim 15, wherein each device electrode corresponds to each counterbore and an internal wire connection part.

17. The structure of heat dissipation substrate according to claim 16, wherein the device electrodes are arranged on upper, lower and inner surfaces of the printed circuit board at both sides of each slot.

18. The structure of heat dissipation substrate according to claim 13, wherein M+1 position lines for cutting are arranged at ends of counterbore columns on the circuit board, each corresponding to the middle between two adjacent counterbore columns;
N+1 position lines for cutting are arranged at ends of counterbore rows on the printed circuit board, each corresponding to the middle between two adjacent counterbore rows;
a plurality of slots and/or holes are arranged at both sides of each counterbore column or row.

19. The structure of heat dissipation substrate according to claim 18, wherein the plurality of slots and/or holes are co-linear with the position lines for cutting arranged at both ends of counterbore columns or rows.

20. The structure of heat dissipation substrate according to claim 19, wherein at least one slot or hole is arranged at the side of each counterbore in every counterbore column or row.

21. The structure of heat dissipation substrate according to claim 19, wherein device electrodes are arranged at both sides of the plurality of slots and/or holes on the printed circuit board, each corresponding to a counterbore and an internal wire connection part.

22. The structure of heat dissipation substrate according to claim 21, wherein the device electrodes are arranged on the upper, lower and inner surfaces of the slots or holes on the printed circuit board.

* * * * *